United States Patent
Huang et al.

(10) Patent No.: US 7,208,426 B2
(45) Date of Patent: Apr. 24, 2007

(54) PREVENTING PLASMA INDUCED DAMAGE RESULTING FROM HIGH DENSITY PLASMA DEPOSITION

(75) Inventors: Liu Huang, Singapore (SG); John Sodijono, Singapore (SG)

(73) Assignee: Chartered Semiconductors Manufacturing Limited, Singapore (SG)

( * ) Notice: Subject to any disclaimer, the term of this patent is extended or adjusted under 35 U.S.C. 154(b) by 0 days.

(21) Appl. No.: 10/012,290

(22) Filed: Nov. 13, 2001

(65) Prior Publication Data

US 2003/0092284 A1    May 15, 2003

(51) Int. Cl.
*H01L 21/31* (2006.01)
*H01L 23/58* (2006.01)
(52) U.S. Cl. .......................... 438/788; 257/646
(58) Field of Classification Search ............. 438/787, 438/788, 778; 257/646, 635, 637, 644, 650
See application file for complete search history.

(56) References Cited

U.S. PATENT DOCUMENTS

| | | | | |
|---|---|---|---|---|
| 5,424,570 A | * | 6/1995 | Sardella et al. | 257/333 |
| 5,534,731 A | * | 7/1996 | Cheung | 257/759 |
| 5,578,524 A | * | 11/1996 | Fukase et al. | 438/624 |
| 5,602,056 A | * | 2/1997 | Jain et al. | 438/586 |
| 5,795,833 A | * | 8/1998 | Yu et al. | 438/763 |
| 5,968,610 A | * | 10/1999 | Liu et al. | 427/579 |
| 5,985,769 A | * | 11/1999 | Matsuura | 438/787 |
| 6,165,915 A | * | 12/2000 | Jang | 438/787 |
| 6,207,590 B1 | * | 3/2001 | Shan | 438/788 |
| 6,211,570 B1 | * | 4/2001 | Kakamu | 257/760 |
| 6,255,193 B1 | | 7/2001 | Sperlich et al. | |
| 6,284,644 B1 | * | 9/2001 | Aug et al. | 438/623 |
| 6,303,525 B1 | * | 10/2001 | Annapragada | 438/782 |
| 6,331,472 B1 | * | 12/2001 | Liu et al. | 438/424 |
| 6,376,360 B1 | * | 4/2002 | Cha et al. | 438/624 |
| 6,399,482 B1 | * | 6/2002 | Lou | 438/636 |
| 6,451,687 B1 | * | 9/2002 | Liu et al. | 438/624 |
| 6,503,818 B1 | * | 1/2003 | Jang | 438/584 |
| 2001/0048146 A1 | * | 12/2001 | Wen et al. | 257/639 |

FOREIGN PATENT DOCUMENTS

| | | | |
|---|---|---|---|
| EP | 0766291 A1 | * | 4/1997 |
| JP | 62031139 A | | 2/1987 |
| TW | 444343 | | 7/2001 |

* cited by examiner

*Primary Examiner*—Lex H. Malsawma

(57) ABSTRACT

A method and apparatus for preventing plasma induced damage resulting from high density plasma deposition processes. In the present embodiment, Un-doped Silica Glass (USG) is deposited so as to form a USG liner. In the present embodiment, the USG liner directly overlies a conductive interconnect structure that couples to semiconductor devices that are susceptible to plasma-induced damage during high density plasma deposition processes. A silicon-rich oxide is deposited in-situ immediately following the deposition of the USG liner so as to form a silicon-rich oxide liner that directly overlies the USG liner. The silicon-rich oxide liner protects the interconnect structure during the subsequent high density plasma deposition process, preventing damage resulting from plasma charge to the interconnect structure.

20 Claims, 5 Drawing Sheets

PREVENTING PLASMA INDUCED DAMAGE RESULTING FROM HIGH DENSITY PLASMA DEPOSITION

BACKGROUND OF THE INVENTION

1. Field of the Invention

The present invention relates to the field of semiconductor devices. More particularly, the present invention relates to a method and apparatus for preventing plasma induced damage that results from high density plasma deposition processes.

2. Related Art

In conventional in Complimentary Metal Oxide Semiconductor (CMOS) device fabrication processes, semiconductor devices are formed on a semiconductor substrate using a thin gate oxide layer that forms gates between conductive regions in the semiconductor substrate. Overlying metal interconnect structures provide for electrical connection to the underlying semiconductor devices.

As semiconductor devices continue to be reduced in size, fabrication process have evolved that use ultra-thin gate oxide layers. These ultra-thin gate oxide layers are desirable for forming semiconductor devices having sizes smaller than 0.18 microns. However, one problem that arises in the fabrication of sub 0.18 micron semiconductor devices is that high density plasma deposition processes can damage the underlying ultra-thin gate oxide layer, leading to device failures. More particularly, when a high density plasma deposition process is performed over a metal interconnect structure, plasma charge is conveyed through the metal interconnect structure to the underlying devices, damaging the thin gate oxide layer and resulting in device failure.

As CMOS processes continue to scale down, the deposition-to-sputter ratio of high density plasma chemical vapor deposition processes has to be further reduced in order to deliver a void-free dielectric layer. However, deposition with low deposition-to-sputter ratio can generate non-uniform plasma and can cause radiation damage to underlying semiconductor devices.

Recent semiconductor fabrication processes have used a Un-doped Silica Glass(USG) liner that is deposited immediately before high density plasma deposition processes to protect the underlying devices from high density plasma related damage. However, it is difficult to optimize the thickness of the pre-deposited liner. A thin liner is not sufficient to protect the underlying gate oxide from high density plasma related damage. A thick liner is effective for preventing charging damage, but strongly reduces the gap-fill capability of the high density plasma deposition process. Therefore, it is difficult to obtain a USG liner that is effective for protecting the metal interconnect from plasma charge and that does not significantly reduce the gap-fill capabilities of the high density plasma deposition process. Thus, plasma related damage often occurs in spite of the use of a USG liner(e.g., as a result of nonuniformities in the USG liner or as a result of corner clipping).

What is needed is a method and apparatus for preventing plasma induced damage resulting from high density plasma deposition processes. In addition, a method and apparatus is needed for preventing plasma induced damage to the ultra-thin gate oxide of the underlying devices. In addition, a method and apparatus is needed that is suitable for sub 0.18 micron fabrication processes. Moreover, a method and apparatus is needed that does not reduce the gap-fill capability of the high density plasma deposition process. The present invention provides a solution to the above needs.

SUMMARY OF THE INVENTION

The present invention provides a method and apparatus for preventing plasma induced damage resulting from high density plasma deposition processes. More particularly, the method and apparatus of the present invention prevents plasma-induced damage to ultra-thin gate oxide of underlying semiconductor devices. In addition, the method and apparatus of the present invention is suitable for sub 0.18 micron fabrication processes and does not reduce the gap-fill capability of the high density plasma deposition process.

In the present embodiment, semiconductor devices are formed on a semiconductor substrate using conventional methods. In the present embodiment, semiconductor devices are formed using an ultra-thin gate oxide layer that forms gates between conductive regions in the semiconductor substrate. These devices are connected to an overlying metal interconnect structure that connects to the underlying semiconductor devices.

The method and apparatus of the present invention includes the deposition of Un-doped Silica Glass(USG) to form a USG liner. In the present embodiment, the USG liner directly overlies the metal structure.

A silicon-rich oxide is then deposited to form a silicon-rich oxide liner. In the present embodiment, the silicon-rich oxide liner is deposited in-situ immediately following deposition of the USG liner such that the silicon-rich oxide liner directly overlies the USG liner. The silicon-rich oxide liner protects the metal structure from plasma charge during the subsequent high density plasma deposition process.

The high density plasma deposition process can then be performed. During the high density plasma deposition process, the underlying silicon-rich oxide liner prevents damage to underlying structures. More particularly, because silicon-rich oxide has lower high density plasma removal rate than a conventional USG liner, the use of a silicon-rich oxide liner is more effective than conventional USG liners in preventing damage during high density plasma deposition processes. In addition, because the silicon-rich liner is more dense than a conventional USG liner, a thin silicon-rich liner is sufficient to protect the underlying metal structures from corner clipping; thereby preventing metal structures from being exposed to plasma charge. By preventing exposure of metal structures to plasma charge, damage to the ultra-thin oxide layer of underlying devices is avoided.

The thin silicon-rich liner of the present invention does not significantly reduce the gap-fill capability of the high density plasma deposition process. Thereby, a structure with good fill characteristics is obtained.

In the present embodiment, the deposition of the USG liner, the deposition of silicon-rich oxide liner, and the high density plasma deposition step are performed sequentially, without removing the substrate from the deposition chamber. Because the method and apparatus of the present invention is formed using sequential in-situ deposition steps, the present invention does not significantly affect process flow or process throughput.

The method and apparatus of the present invention is suitable for sub 0.18 micron fabrication processes. Thus, as geometry's continue to shrink in size, the method and apparatus of the present invention effectively allows for production of CMOS devices, preventing device failures associated with plasma-induced damage resulting from high density plasma deposition processes.

The present invention provides a method and apparatus for preventing plasma induced damage resulting from high density plasma deposition processes. In addition, the present invention provides a method and apparatus for preventing plasma induced damage to the ultra-thin gate oxide of underlying devices. In addition, the present invention provides a method and apparatus that is suitable for sub 0.18 micron fabrication processes. Moreover, the present invention provides a method and apparatus that does not reduce the gap-fill capability of the high density plasma deposition process.

These and other objects and advantages of the present invention will become obvious to those of ordinary skill in the art after having read the following detailed description of the preferred embodiments that are illustrated in the various drawing figures.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Figure 1:
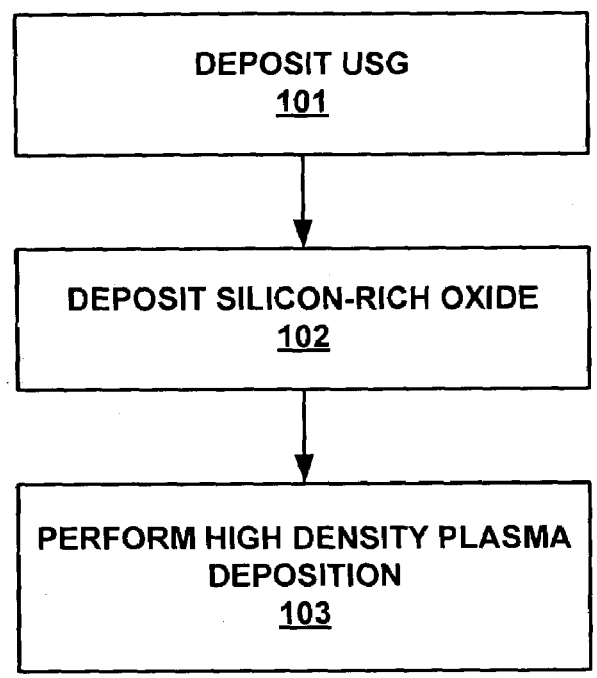
FIG. 1 shows a method for preventing plasma induced damage resulting from high density plasma deposition in accordance with one embodiment of the present invention.

FIG. 1 shows a method for preventing plasma induced damage resulting from high density plasma deposition processes in accordance with one embodiment of the present invention. First, as shown by step 101, Un-doped Silica Glass(USG) is deposited. In the present embodiment, USG is deposited in-situ so as to form a USG liner.

Continuing with step 101, in the present embodiment, USG is deposited so as to form a USG liner having a thickness of from 50 to 200 Angstroms. However, the present invention is well adapted for use of a USG liner having other thicknesses.

Still referring to step 101, in one embodiment of the present invention, the reflective index of the USG liner is controlled in the range of 1.45 to 1.46. This is accomplished by tuning the $O_2$ to USG ratio and the source RF power to achieve USG deposition having the desired reflexivity index. In the present embodiment, bias power is not used in deposition step 101.

Figure 2:
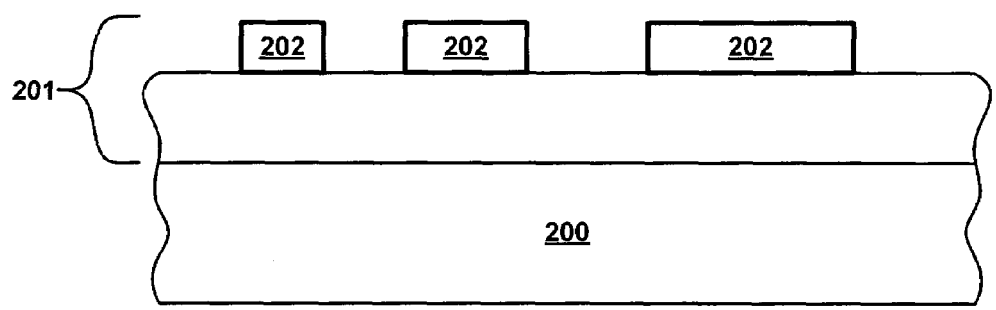
FIG. 2 is a side cut-away view of a semiconductor substrate having devices formed thereover and having interconnect structures formed thereon in accordance with one embodiment of the present invention.

FIG. 2 shows an exemplary structure that can be damaged by plasma charge produced in a high density plasma deposition process. In this embodiment, semiconductor substrate 200 is shown to have structures 201 formed thereover. In the present embodiment, structures 201 include semiconductor devices(not shown) that are formed on silicon substrate 200. In one embodiment, semiconductor devices are formed using an ultra-thin oxide layer that extends between conductive regions formed within the silicon substrate 200.

Continuing with FIG. 2, in the present embodiment, structures 201 include interconnect structures 202 that are selectively electrically connected to the underlying semiconductor devices. In the present embodiment, interconnect structures 202 are metal interconnects. However, the present invention is well adapted for the use of interconnect structures 202 that are made of other materials.

Structures 201 formed on semiconductor substrate 200 are representative of structures that can be protected according to method 100 of FIG. 1. However, method 100 of FIG. 1 is well adapted for protecting other types of structures that are susceptible to damage as a result of high density plasma deposition processes.

Figure 3:
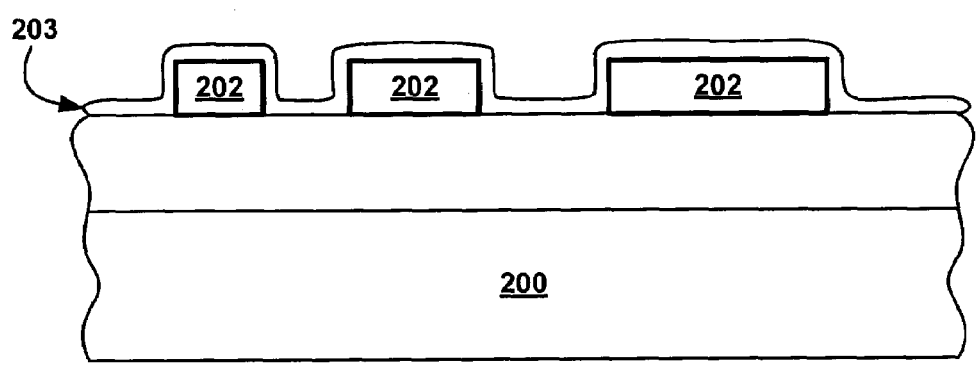
FIG. 3 is a diagram that illustrates deposition of USG so as to form a USG liner that overlies the structure of FIG. 2 in accordance with one embodiment of the present invention.

Referring now to FIG. 3, the structure of FIG. 2 is shown after deposition of USG thereover in accordance with step 101 of FIG. 1 to form USG liner 203. It can be seen that USG liner 203 directly overlies the structures that are to be protected from plasma charge(i.e., interconnect structures 202).

Next, as shown by step 102, silicon-rich oxide is deposited. In the present embodiment, the silicon-rich oxide is deposited in-situ immediately following the deposition of the USG liner so as to form a silicon-rich oxide liner. In the present embodiment, the in-situ deposition process results in a silicon-rich oxide liner that directly overlies the USG liner.

Continuing with step 102, in the present embodiment, silicon-rich oxide is deposited so as to form a silicon-rich oxide liner having a thickness of from 300 to 600 Angstroms. However, the present invention is well adapted for use of a silicon-rich oxide liner having other thicknesses.

Continuing with step 102, in the present embodiment, the reflective index of the silicon-rich oxide liner is controlled in the range of 1.50 to 1.70. This is accomplished by tuning the $O_2$ to $SiH_4$ ratio and the source RF power to achieve silicon-rich oxide deposition having the desired reflexivity index. In the present embodiment, bias power is not used in deposition step 102.

Figure 4:
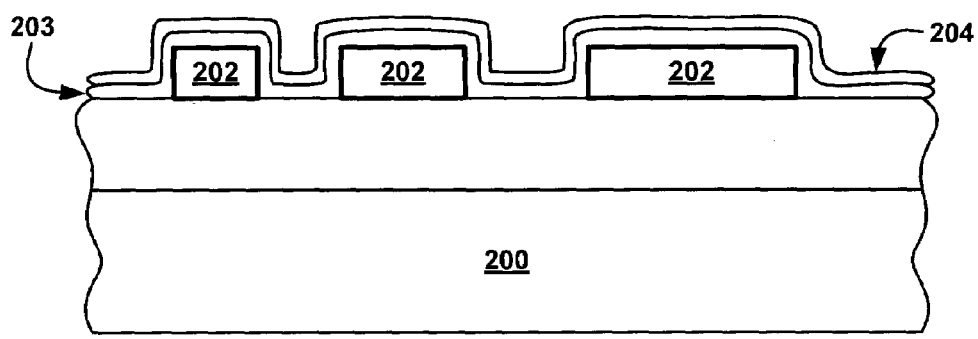
FIG. 4 is a diagram that illustrates the deposition of silicon-rich oxide so as to form a silicon-rich oxide liner that overlies the structure of FIG. 3 in accordance with one embodiment of the present invention.

FIG. 4 shows the structure of FIG. 3 after deposition of a layer of silicon-rich oxide so as to form silicon-rich oxide liner 204. It can be seen that silicon-rich oxide liner 204 directly overlies USG liner 203.

Steps 101–102 of FIG. 1 illustrate specific deposition parameters such as power levels, thicknesses, etc. These process parameters are exemplary only. The method and apparatus of the present invention is well suited to the use of other processes and deposition parameters for forming a USG liner and an overlying silicon-rich oxide liner.

Referring now to step 103, the high density plasma deposition process is performed. In the present embodiment, a dielectric material such as, for example USG, is deposited using a high density plasma chemical vapor deposition process. However, the present invention is well adapted for use of any of a number of different high density plasma deposition processes and the deposition of other materials.

Figure 5:
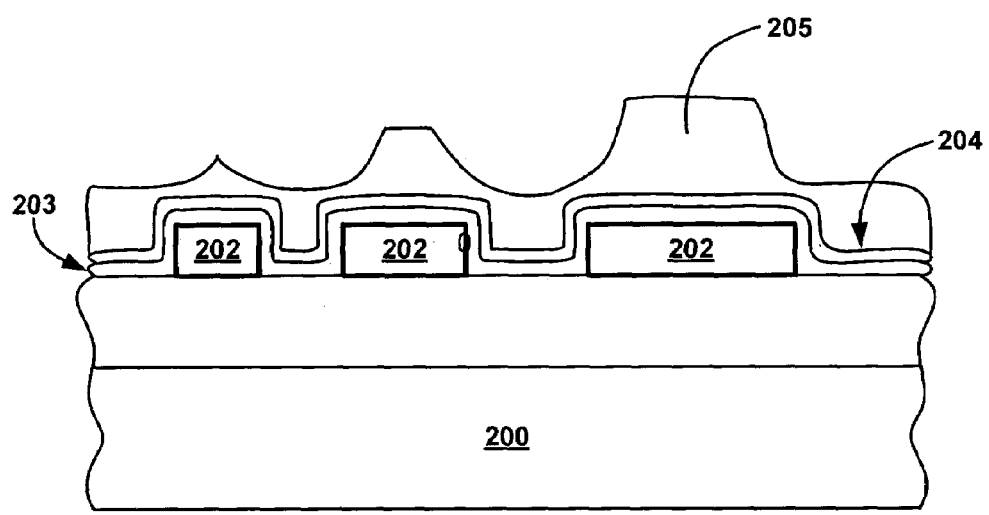
FIG. 5 is a diagram of the structure of FIG. 4 after a high density plasma deposition step has been performed in accordance with one embodiment of the present invention.

FIG. 5 shows the structure of FIG. 4 after a high density plasma deposition process has been performed so as to form dielectric layer 205. It can be seen that dielectric layer 205 directly overlies silicon-rich oxide liner 204.

Steps 101 and 102 of FIG. 1 result in the formation of a silicon-rich oxide liner 204 that prevents damage resulting from high density plasma deposition step 103. More particularly, silicon-rich oxide liner 204 covers and protects metal structures 201 of FIGS. 2–5 during high density plasma deposition step 103. This prevents plasma induced damage to underlying devices and/or structures(e.g., metal structures 202 and underlying structures 201 of FIGS. 2–5) that can occur as a result of high density plasma deposition step 103.

In the present embodiment, the USG liner prevents current leakage in the event that the deposited silicon-rich liner is too silicon rich. That is, in the example shown in FIGS. 2–5, USG liner 201 prevents current leakage in the event that silicon-rich liner 202 is too silicon rich(thereby possibly conducting current to metal structures 202).

Because silicon-rich oxide has lower high density plasma removal rate than a conventional USG liner, the use of a silicon-rich oxide liner is more effective than conventional USG liners in preventing damage during high density plasma chemical vapor deposition processes. In addition, because the silicon-rich liner is more dense than a conventional USG liner, a thin silicon-rich liner is sufficient to protect the underlying metal structures(e.g., metal structures 202 of FIGS. 2–5) from corner clipping; thereby preventing metal structures from being exposed to plasma charge.

The thin silicon-rich liner of the present invention does not significantly reduce the gap-fill capability of the high density plasma deposition process. Thereby, a structure with good fill characteristics is obtained.

In the present embodiment, steps 101–103 are performed sequentially in an in-situ process. That is, USG deposition (step 101) is performed, followed immediately by silicon-rich oxide deposition(step 102), which is immediately followed by high density plasma deposition(step 103). Each of steps 101–103 are performed sequentially, without removing the substrate from the deposition chamber. Because the method and apparatus of the present invention is formed using sequential in-situ deposition steps, the present invention does not significantly affect process flow or process throughput.

The method and apparatus of the present invention is suitable for sub 0.18 micron fabrication processes. Thus, as geometry's continue to shrink in size, the method and apparatus of the present invention effectively allows for production of CMOS devices, preventing device failures associated with plasma-induced damage resulting from high density plasma deposition processes.

The present invention provides a method and apparatus for preventing plasma induced damage resulting from high density plasma deposition processes. In addition, the present invention provides a method and apparatus for preventing plasma induced damage to the ultra-thin gate oxide of underlying devices. In addition, the present invention provides a method and apparatus that is suitable for sub 0.18 micron fabrication processes. Moreover, the present invention provides a method and apparatus that does not reduce the gap-fill capability of the high density plasma deposition process.

In the present embodiment, steps 101 and 102 of FIG. 1 are described as forming a USG liner and a silicon-rich oxide liner, respectively. However, it is appreciated that the term "liner" refers to a layer of material. Thus, the USG liner formed in step 101 is a layer of USG material. Similarly, the silicon-rich oxide liner formed in step 102 is a layer of silicon-rich oxide.

While the present invention has been described in particular embodiments, it should be appreciated that the present invention should not be construed as limited by such embodiments, but rather construed according to the below claims.

What is claimed is:

1. A method for preventing plasma induced damage resulting from high density plasma deposition processes, said method comprising the steps of:
   a) depositing Un-doped Silica Glass (USG) over a semiconductor substrate having structures formed thereon so as to form a USG liner that overlies said structures;
   b) depositing silicon-rich oxide over said USG liner so as to form a silicon-rich liner that directly overlies said USG liner wherein said USG liner and said silicon-rich liner have a combined thickness less than 800 angstroms;
   c) performing a high density plasma deposition process, said silicon-rich oxide liner preventing damage resulting from plasma charge to said structures during said high density plasma deposition process; and
   d) tuning an oxygen to $SiH_4$ gas ratio and a source RF power to achieve a desired reflectivity of said silicon-rich oxide liner, deposited without bias RF power.

2. The method of claim 1 wherein step a) is performed such that the reflective index of said USG liner is in the range of 1.45 to 1.46.

3. The method of claim 2 wherein said step a) is performed such that said USG liner has a thickness of between 50 and 200 Angstroms.

4. The method of claim 1 wherein step b) is performed such that the reflective index of said silicon-rich liner is in the range of 1.50 to 1.70.

5. The method of claim 4 wherein step b) is performed such that said silicon-rich liner has a thickness of between 300 and 600 Angstroms.

6. The method of claim 1 wherein steps a) through c) are performed sequentially in a deposition chamber, without removing said substrate from said deposition chamber.

7. The method of claim 6 wherein step c) is a high density plasma chemical vapor deposition process that deposits a dielectric material.

8. The method of claim 7 wherein step c) is a high density plasma chemical vapor deposition process that deposits USG.

9. A method for preventing plasma induced damage resulting from high density plasma deposition processes, said method comprising the steps of:
   a) forming, on a semiconductor substrate, a plurality of semiconductor devices and a least one conductive interconnect, said at least one conductive interconnect selectively electrically coupled to ones of said plurality of semiconductor devices;
   b) depositing Un-doped Silica Glass (USG) over said semiconductor substrate so as to form a USG liner that directly overlies said at least one conductive interconnect;
   c) depositing silicon-rich oxide over said USG liner so as to form a silicon-rich liner that directly overlies said USG liner wherein said USG liner and said silicon-rich liner have a combined thickness less than 800 angstroms;
   d) performing a high density plasma deposition process, said silicon-rich oxide liner preventing damage to said semiconductor devices during said high density plasma deposition process; and e) tuning an oxygen to $SiH_4$ gas ratio and a source RF power to achieve a desired reflectivity index of said silicon-rich oxide liner, deposited without bias RF power.

10. The method of claim 9 wherein step b) is performed such that the reflective index of said USG liner is in the range of 1.45 to 1.46 and such that said USG liner has a thickness of between 50 and 200 Angstroms.

11. The method of claim 9 wherein step c) is performed such that the reflective index of said silicon-rich liner is in the range of 1.50 to 1.70 and such that said silicon-rich liner has a thickness of between 300 and 600 Angstroms.

12. The method of claim 9 wherein steps b) through d) are performed sequentially in a deposition chamber without removing said substrate from said deposition chamber.

13. The method of claim 9 wherein step d) is a high-density plasma chemical vapor deposition process that deposits USG.

14. A structure formed over a semiconductor substrate, said structure comprising:
   (a) a USG liner, said USG liner disposed over said semiconductor substrate such that said USG liner overlies an interconnect structure;
   (b) a silicon-rich oxide liner, said silicon-rich oxide liner directly overlying said USG liner wherein said USG liner and said silicon-rich liner have a combined thickness less than 800 angstroms; and
   (c) a layer of dielectric material deposited using a high density plasma deposition process, said layer of dielectric material directly overlaying said layer of silicon-rich oxide; wherein an oxygen to $SiH_4$ gas ratio and a source RF power is tuned to achieve a desired reflectivity index of said silicon-rich oxide liner, deposited without bias RF power.

15. The structure of claim 14 wherein the reflective index of said USG liner is between 1.45 and 1.46.

16. The structure of claim 15 wherein said USG liner has a thickness of between 50 and 200 Angstroms.

17. The structure of claim 14 wherein the reflective index of said silicon-rich liner is between 50 and 200 Angstroms.

18. The structure of claim 17 wherein silicone-rich liner has a thickness of between 300 to 500 Angstroms.

19. The structure of claim 14 wherein said layer of dielectric material deposited in c) is USG deposited using a high-density plasma chemical vapor deposition process.

20. The structure of claim 14 wherein said interconnect structure electrically connects to semiconductor devices, said silicon-rich oxide liner preventing damage to said semiconductor devices resulting from plasma charge to said interconnect structure during said high density plasma deposition process.

* * * * *